(12) United States Patent
Naito et al.

(10) Patent No.: US 10,559,361 B2
(45) Date of Patent: Feb. 11, 2020

(54) SEMICONDUCTOR DEVICE AND CONTROL METHOD

(71) Applicant: Toshiba Memory Corporation, Minato-ku (JP)

(72) Inventors: Shinya Naito, Toyoda (JP); Takayuki Kakegawa, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/126,516

(22) Filed: Sep. 10, 2018

(65) Prior Publication Data
US 2019/0287628 A1    Sep. 19, 2019

(30) Foreign Application Priority Data
Mar. 16, 2018  (JP) .................................. 2018-049770

(51) Int. Cl.
*G11C 16/06*  (2006.01)
*G11C 16/26*  (2006.01)
(Continued)

(52) U.S. Cl.
CPC .......... *G11C 16/26* (2013.01); *H01L 27/1157* (2013.01); *H01L 27/11565* (2013.01);
(Continued)

(58) Field of Classification Search
CPC ....... H01L 27/11582; H01L 2924/0002; H01L 27/11575; H01L 27/1157; H01L 2924/00; H01L 21/76816; H01L 27/11565; H01L 23/5226; H01L 21/11568; H01L 29/66833; H01L 29/7926

USPC .......... 257/324, E29.309, 314, 40, E33.053, 257/E29.3, 319, 326, 72, E21.21, 257/E21.414, E21.422, E21.473; 365/185.14, 185.18, 185.27, 185.23, 161, 365/185.25, 230.06, 87, 184; 438/269, 438/22, 151, 268, 270, 591, 637, 82, 99, 438/104, 128, 149, 156, 158, 163, 197, 438/201, 211

See application file for complete search history.

(56) References Cited

U.S. PATENT DOCUMENTS 9,754,957 B2  9/2017  Lee et al.
9,806,091 B2  10/2017  Miyagawa et al.
(Continued)

*Primary Examiner* — Thong Q Le
(74) *Attorney, Agent, or Firm* — Oblon, McClelland, Maier & Neustadt, L.L.P.

(57) ABSTRACT

According to one embodiment, there is provided a semiconductor device including a first semiconductor region, a stacked body, a semiconductor channel, a gate insulating film, and a control circuit. The stacked body is of conductive films arranged in a stacking direction with an insulator interposed. The semiconductor channel penetrates the stacked body in the stacking direction, and is electrically connected at one end to the first semiconductor region. The gate insulating film is arranged between the stacked body and the semiconductor channel. The control circuit supplies a first voltage to a closest conductive film of the stacked body to the first semiconductor region, and supplies a second voltage higher than the first voltage to the first semiconductor region, at a time of reading information from one of memory cells formed at positions where the conductive films intersect with the semiconductor channel.

20 Claims, 10 Drawing Sheets

(51) Int. Cl.
*H01L 27/11565* (2017.01)
*H01L 27/11582* (2017.01)
*H01L 27/1157* (2017.01)
*G11C 11/56* (2006.01)
*H01L 23/522* (2006.01)
*G11C 16/04* (2006.01)

(52) U.S. Cl.
CPC .... *H01L 27/11582* (2013.01); *G11C 11/5671* (2013.01); *G11C 16/0483* (2013.01); *H01L 23/5226* (2013.01)

(56) References Cited

U.S. PATENT DOCUMENTS

| | | |
|---|---|---|
| 2010/0329026 A1 | 12/2010 | Nakamura et al. |
| 2017/0148517 A1 | 5/2017 | Harari |
| 2018/0277560 A1* | 9/2018 | Zushi ................ H01L 27/11582 |

* cited by examiner

SEMICONDUCTOR DEVICE AND CONTROL METHOD

CROSS-REFERENCE TO RELATED APPLICATIONS

This application is based upon and claims the benefit of priority from Japanese Patent Application No. 2018-049770, filed on Mar. 16, 2018; the entire contents of which are incorporated herein by reference.

FIELD

Embodiments described herein relate generally to a semiconductor device and a control method.

BACKGROUND

In a semiconductor device having a three-dimensional structure, a stacked body of conductive films and insulating films alternately stacked one by one is provided with semiconductor pillars penetrating the stacked body. With this arrangement, a three-dimensional array of memory cells can be constructed such that the memory cells are formed at positions where the conductive films intersect with the semiconductor pillars. In this case, it is desired to enable information stored in memory cells to be properly read.

DETAILED DESCRIPTION

Figure 1:
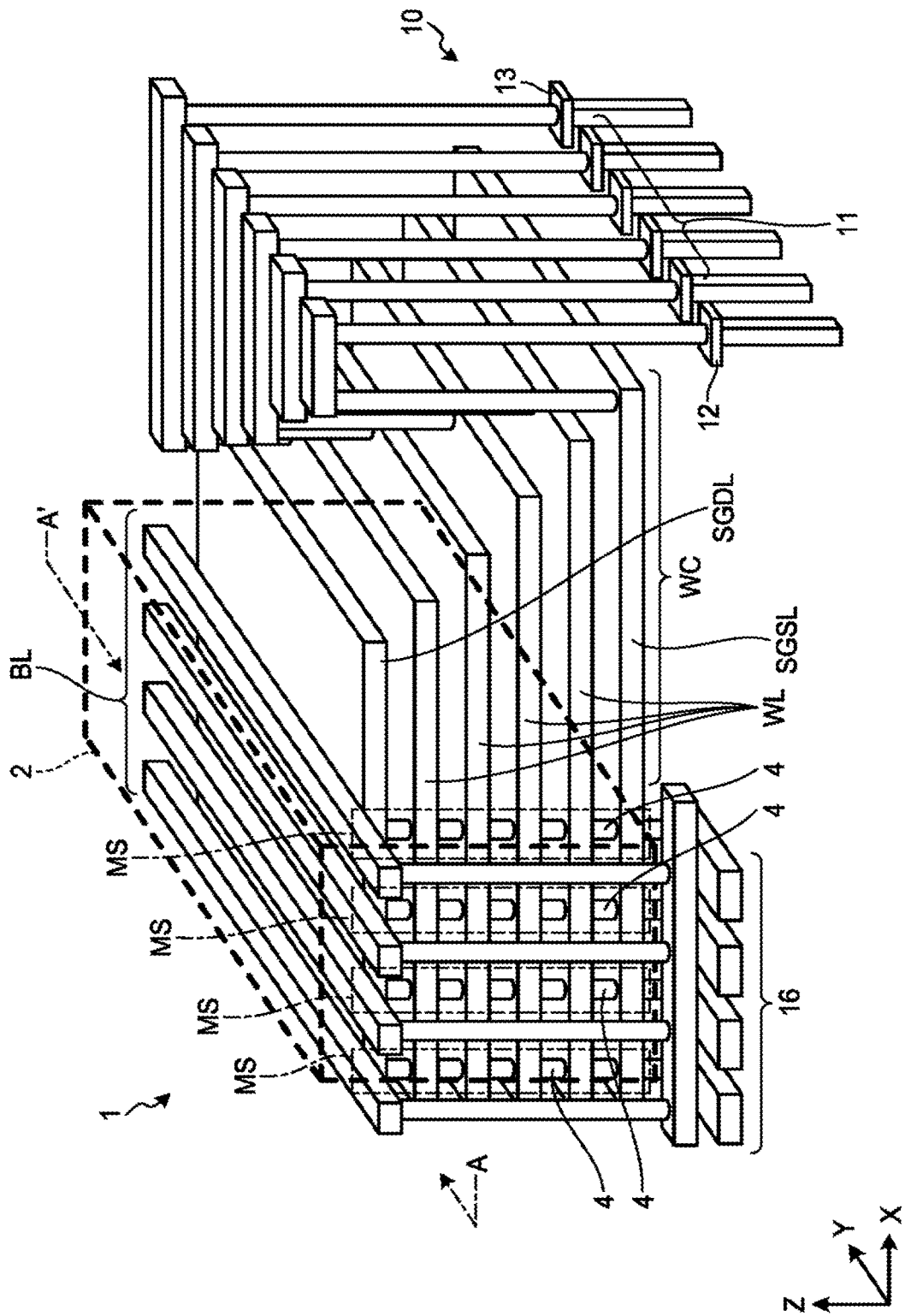
FIG. 1 is a perspective view illustrating a configuration of a semiconductor device according to an embodiment.

In general, according to one embodiment, there is provided a semiconductor device including a first semiconductor region, a stacked body, a semiconductor channel, a gate insulating film, and a control circuit. The stacked body is of conductive films arranged in a stacking direction with an insulator interposed. The semiconductor channel penetrates the stacked body in the stacking direction, and is electrically connected at one end to the first semiconductor region. The gate insulating film is arranged between the stacked body and the semiconductor channel. The control circuit supplies a first voltage to a closest conductive film of the stacked body to the first semiconductor region, and supplies a second voltage higher than the first voltage to the first semiconductor region, at a time of reading information from one of memory cells formed at positions where the conductive films intersect with the semiconductor channel.

Exemplary embodiments of a semiconductor device will be explained below in detail with reference to the accompanying drawings. The present invention is not limited to the following embodiments.

(Embodiment)

As a semiconductor device, there is a configuration in which a stacked body of conductive films and insulating films alternately stacked one by one is provided with columnar semiconductor pillars penetrating the stacked body, such that a three-dimensional array of memory cells (memory cell array) is constructed. According to this semiconductor device, as the storage capacity can be increased by increasing the number of stacked films, it becomes less necessary to utilize more advanced patterning techniques, and thus it becomes possible to reduce the cost per bit easily.

Where the semiconductor device is a three-dimensional semiconductor memory, regions at which the conductive films intersect with the semiconductor pillars are configured to function as memory cells, and a memory cell array is thereby constructed which includes a plurality of memory cells arrayed in a three-dimensional state. Those portions of the conductive films which intersect with the semiconductor pillars can serve as the control gates of the memory cells, and the rest of the conductive films can serve as word lines to transmit signals to the control gates. In order to control the ON/OFF of the memory cells, control signals are transmitted from wiring layers via contacts to extended portions of the conductive films (portions that have been processed in a stepwise state), and are further transmitted to those portions of the conductive films (control gates) which intersect with the semiconductor pillars.

In a process of reading information from memory cells, read voltage applied to the control gate of each memory cell is varied, and a threshold voltage is detected on the basis of a read voltage at the boundary where the ON/OFF of the memory cell is changed. At this time, in the ON-state of the memory cell, a cell current flows as charges move in the vertical direction through the corresponding semiconductor pillar. In the OFF-state of the memory cell, a cell current smaller than that of the ON-state flows, or substantially no cell current flows, through the semiconductor pillar. By utilizing this difference in cell current level between the ON-state and the OFF-state, a sense amplifier circuit arranged around the memory cell array detects the threshold voltage. In accordance with this detection result, the information stored in the memory cells can be restored. Accordingly, it is desired to make sure that the cell current in the ON-state of each memory cell is larger than the cell current in the OFF-state.

However, where the semiconductor device is a three-dimensional semiconductor memory, and each semiconductor pillar that can serve as a channel region is made of a film containing, for example, poly-silicon as the main component, defects can be easily generated near the interface between the semiconductor pillar and the gate insulating film. Further, where the semiconductor pillar is structured together with a core insulating film extending through the central side, the electric potential of the semiconductor pillar is set in a floating state during a read process. In this state, when an electron current flows near the interface between the semiconductor pillar and the gate insulating film, electron traps may be generated by defects, and make the cell current apt to attenuate. If the cell current attenuates, the influence of noises and/or fixed charge amount changes comes to easily appear, and so it becomes difficult to properly read information stored in memory cells.

In consideration of the above, according to this embodiment, when a semiconductor device is operated to read information from memory cells, voltage application for holes is performed in addition to voltage application for electrons. This causes a hole current to flow near the interface between the semiconductor pillar and the core insulating film while causing an electron current to flow near the interface between the semiconductor pillar and the gate insulating film, thereby to increase the cell current.

Figure 2:
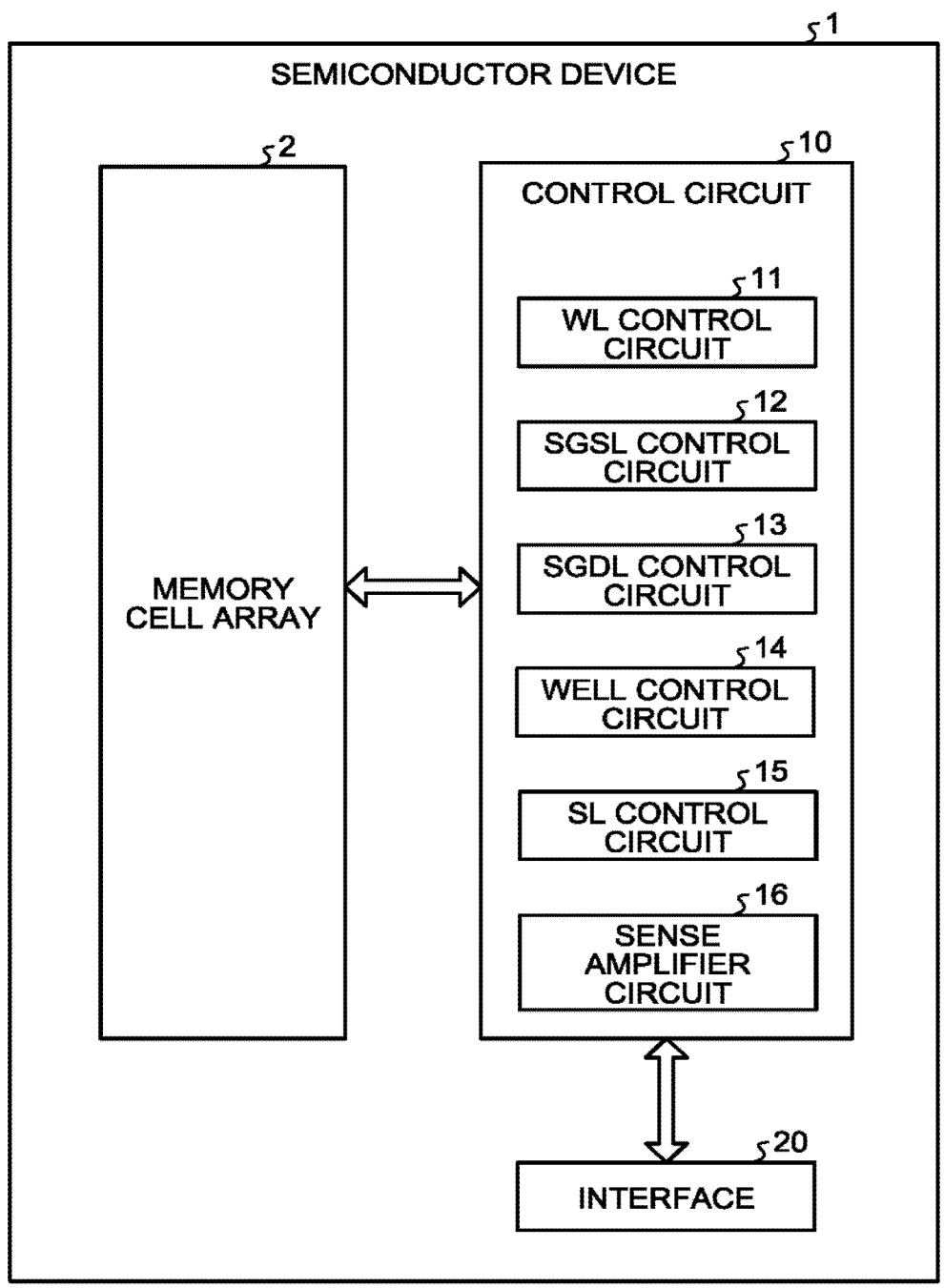
FIG. 2 is a block diagram illustrating a configuration of the semiconductor device according to the embodiment.

Specifically, the semiconductor device 1 is configured as illustrated in FIGS. 1 and 2. FIG. 1 is a perspective view illustrating a configuration of the semiconductor device 1. FIG. 2 is a block diagram illustrating a configuration of the semiconductor device 1.

The semiconductor device 1 is a three-dimensional semiconductor memory, and is a NAND type flash memory, for example. The semiconductor device 1 includes a memory cell array 2, a control circuit 10, an interface 20, word lines WL, a selection gate line SGSL, a selection gate line SGDL, bit lines BL, and a source line SL (see FIG. 3). The control circuit 10 includes a WL control circuit 11, an SGSL control circuit 12, an SGDL control circuit 13, a well control circuit 14, an SL control circuit 15, and a sense amplifier circuit 16. Hereinafter, the extending direction of the bit lines BL will be referred to as a Y-direction, the stacking direction of memory cell transistors will be a Z-direction, and a direction perpendicular to the Y-direction and the Z-direction will be an X-direction.

Figure 5:
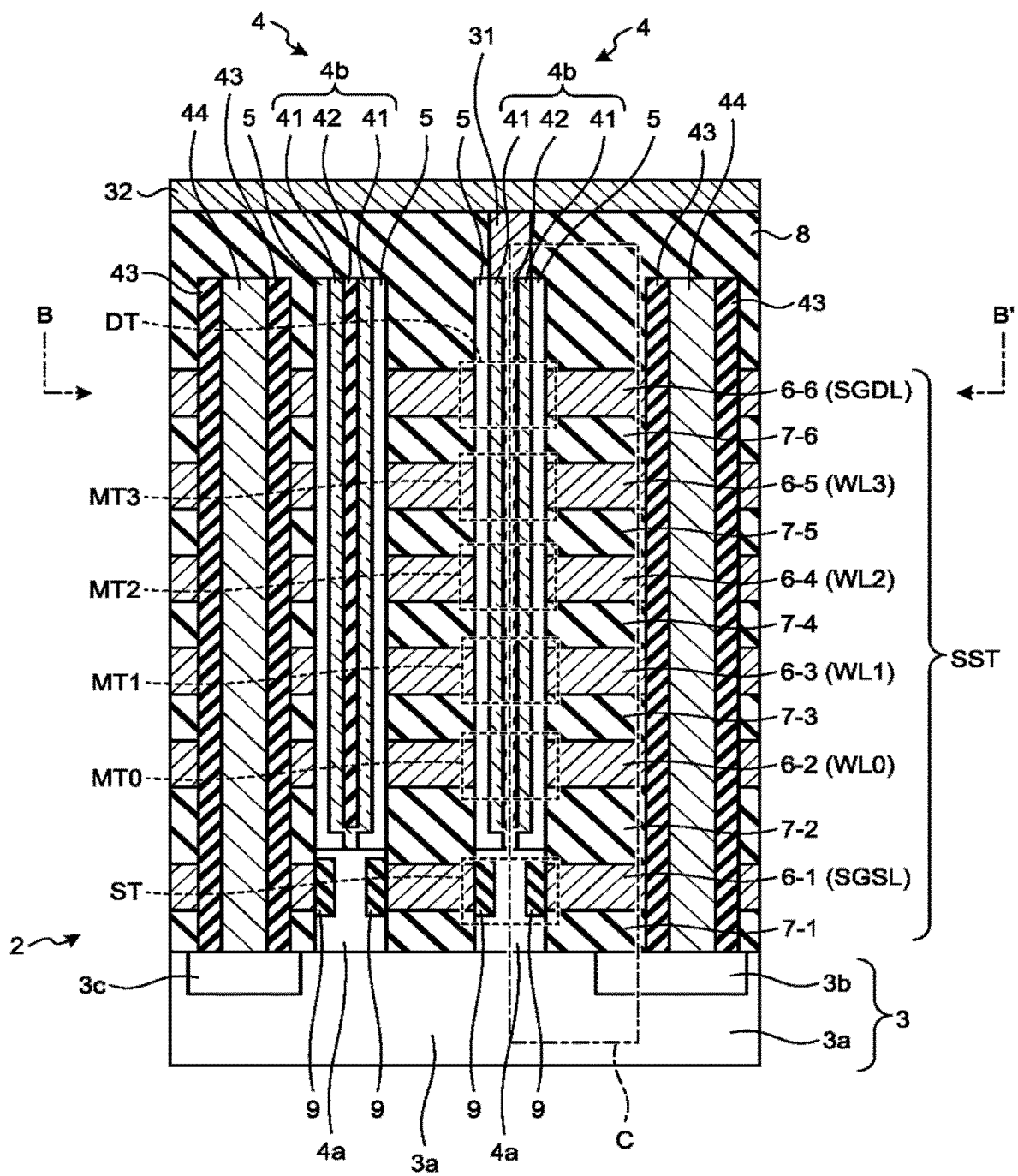
FIG. 5 is a diagram illustrating a sectional configuration of the memory cell array according to the embodiment.

The memory cell array 2 illustrated in FIG. 1 has a configuration in which a plurality of memory strings MS are arranged on a substrate 3 (see FIG. 5). Here, each memory string MS includes a memory cell column composed of one or more memory cell transistors (each of which will also be simply referred to as "memory cell", hereinafter) arrayed in the Z-direction, together with a drain-side selection transistor DT and a source-side selection transistor ST respectively provided at the upper and lower ends of the memory cell column. Pillar members 4 penetrate a stacked body SST (see FIG. 5) of conductive films (SGSL, WLs, and SGDL) arranged in the Z-direction with an insulator interposed therebetween. In such a structure, a plurality of memory cells MT0 to MT7 and selection transistors DT and ST are formed at positions where the conductive films (SGSL, WLs, and SGDL) intersect with each pillar member 4. In each of the memory cells MT0 to MT7, that portion of the corresponding plat-like conductive film (word line WL) which intersects with the corresponding pillar member 4 serves as a control gate. In the drain-side selection transistor DT, that portion of the corresponding plat-like conductive film (selection gate line SGDL) which intersects with the corresponding pillar member 4 serves as a control gate. In the source-side selection transistor ST, that portion of the corresponding plat-like conductive film (selection gate line SGSL) which intersects with the corresponding pillar member 4 serves as a control gate. FIG. 5 illustrates as an example a case where one memory string MS is provided with memory cells in four layers.

Each word line WL connects the control gates of memory cells at the same height to each other among memory strings MS present within a predetermined range. Further, the selection gate line SGSL connects the control gates of source-side selection transistors ST to each other among the memory strings MS present within the predetermined range. The selection gate line SGDL connects the control gates of drain-side selection transistors DT to each other among the memory strings MS present within the predetermined range. Further, the bit lines BL extend in the Y-direction, and are connected to the upper sides of the respective memory strings MS.

The WL control circuit 11 is a circuit for controlling voltage to be applied to the word lines WL. The SGSL control circuit 12 is a circuit for controlling voltage to be applied to the selection gate line SGSL. The SGDL control circuit 13 is a circuit for controlling voltage to be applied to the selection gate line SGDL. The well control circuit 14 is a circuit for controlling voltage to be applied to substrate voltage lines SUBL. The SL control circuit 15 is a circuit for controlling voltage to be applied to the source line SL. The sense amplifier circuit 16 is a circuit for detecting the threshold voltage of a selected memory cell in accordance with a signal read from the memory cell.

The word lines WL and the selection gate lines SGSL and SGDL of the memory cell array 2 are connected to the WL control circuit 11, the SGSL control circuit 12, and the SGDL control circuit 13, through respective contacts in a word line contact part WC (electrode line contact part) provided for the memory cell array 2. The word line contact part WC is arranged on that side of the memory cell array 2 which faces the WL control circuit 11, and is structured such that the word lines WL and the selection gate lines SGSL and SGDL, which are connected to the memory cells and the selection transistors present at respective heights, have been processed in a stepwise state.

The control circuit 10 illustrated in FIG. 2 controls operations of the semiconductor device 1, on the basis of instructions input via the interface 20 from outside (for example, a memory controller). For example, upon reception of a write instruction, the control circuit 10 writes instructed write data into memory cells of the memory cell array 2 at instructed addresses. Further, upon reception of a read instruction, the control circuit 10 reads data from memory cells of the memory cell array 2 at instructed addresses, and outputs the data via the interface 20 to outside (the memory controller).

Figure 3:
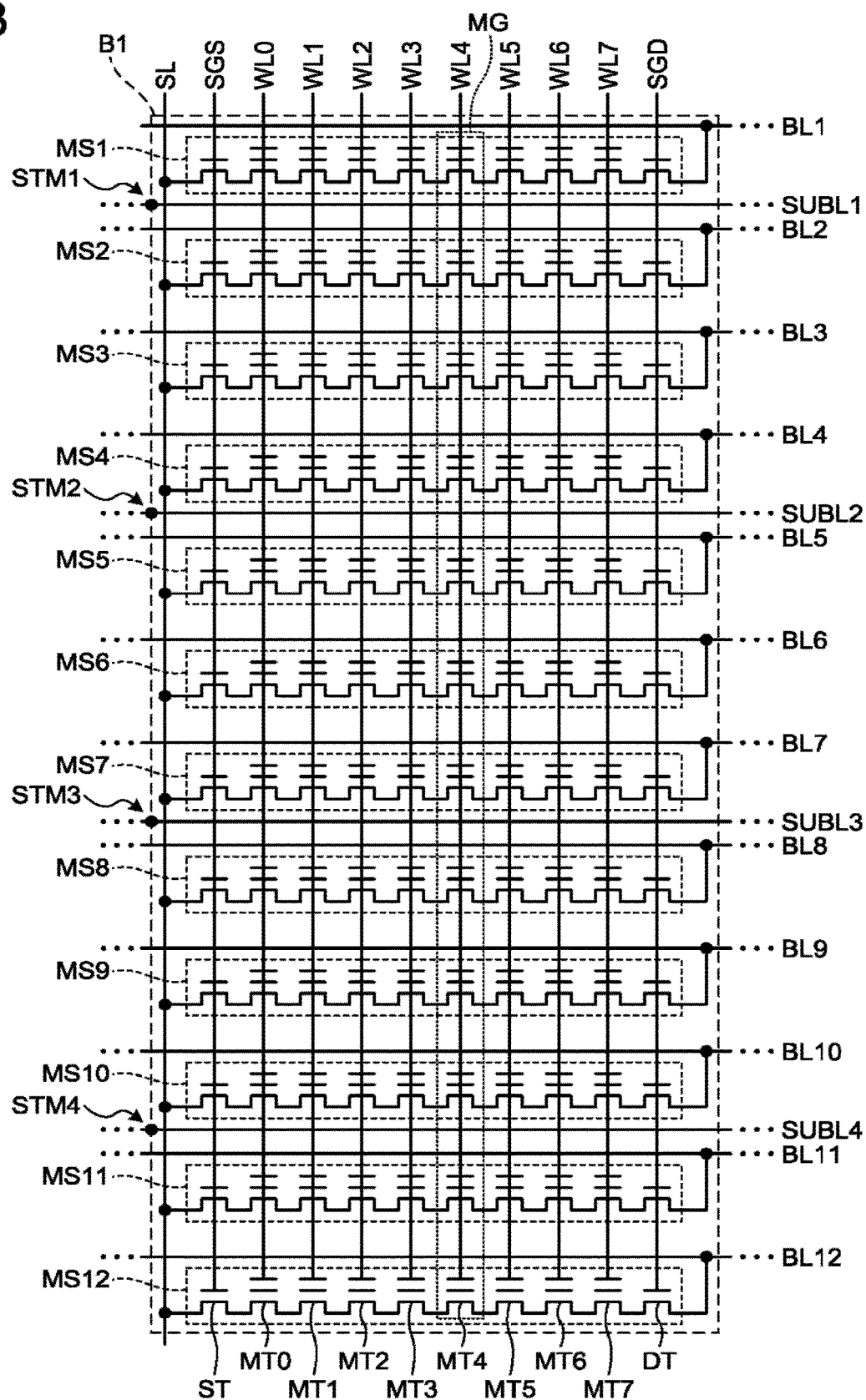
FIG. 3 is a diagram illustrating a circuit configuration of a memory cell array according to the embodiment.

Next, an explanation will be given of a circuit configuration of the memory cell array 2, with reference to FIG. 3. FIG. 3 is a diagram illustrating a circuit configuration of the memory cell array 2, and illustrates as an example one block B1 of a plurality of blocks B1 to Bn included in the memory cell array 2; however, the other blocks B2 to Bn are the same as the block B1.

As illustrated in FIG. 3, the block B1 is provided with eight word lines WL0 to WL7, selection gate lines SGDL and SGSL, and a source line SL, for example. Further, the blocks B1 to Bn are provided with twelve bit lines BL1 to BL12 in common, for example. Here, FIG. 3 illustrates as an example a case where the number of word lines is eight and the number of bit lines is twelve; however, the number of word lines and the number of bit lines are not limited to this example.

Further, in the block B1, twelve memory strings MS1 to MS12 are arrayed in the row direction. The memory strings MS1 to MS 12 correspond to the bit lines BL1 to BL12, respectively, and are connected to the corresponding bit lines BL1 to BL12, respectively.

Each of the memory strings MS1 to MS12 includes memory cells MT0 to MT7 and selection transistors DT and ST arranged in the column direction. Each of the memory cells MT0 to MT7 is formed of a single transistor, for example. Here, the memory cells MT0 to MT7 are connected in series.

Further, each of the selection transistors DT and ST is formed of a single transistor, for example. The drain-side selection transistor DT is connected in series to the memory cell MT7 on the most drain side of the memory cells MT0 to MT7. The source-side selection transistor ST is connected in series to the memory cell MT0 on the most source side of the memory cells MT0 to MT7. In this way, each of the memory strings MS1 to MS12 is structured.

Here, in each of the memory strings MS1 to MS12, the control gates of the memory cells MT0 to MT7 are connected to the word lines WL0 to WL7, respectively. Further, one end of each of the memory strings MS1 to MS12 is connected to the corresponding one of the bit lines BL1 to BL12 through the drain-side selection transistor DT. The other end of each of the memory strings MS1 to MS12 is connected to the source line SL through the source-side selection transistor ST.

Further, in the memory strings MS1 to MS12, where each memory cell is configured to store one bit, one memory group MG may be composed of, for example, twelve memory cells MTk-1 to MTk-12 connected to a word line WLk (for example, k=0 to 7). Here, for example, a memory cell connected to the word line WL3 and the memory string MS1 will be referred to as "MT3-1". Further, also where each memory cell is configured to store a multi-level value of a "p"-number of bits (p is an integer of 2 or more), a memory group MG for at most the "p"-number of bits may be composed of, for example, twelve memory cells MTk-1 to MTk-12 connected to a word line WLk.

For example, as illustrated in FIG. 3, in the block B1, substrate terminals STM1 to STM4 are arrayed in a way corresponding to a state where substrate terminals are arranged once in the column direction and a substrate terminal is arranged repeatedly four times in the row direction. Specifically, in the example illustrated in FIG. 3, the array pitch Pr of the substrate terminals in the column direction is equal to the array pitch of the blocks in the column direction, and thus substrate terminals are arranged once for each block when viewed in the column direction. Further, the array pitch of the substrate terminals in the row direction is about three times the array pitch of the bit lines, and thus substrate terminals are arranged once for every three bit lines when viewed in the row direction.

A plurality of substrate voltage lines SUBL1 to SUBL4 extend each in the column direction and are arrayed in the row direction. Specifically, each of the substrate voltage lines SUBL1 to SUBL4 extends between a plurality of bit lines and along the bit lines over a plurality of blocks B1 to Bn, and is connected to the corresponding ones of the substrate terminals.

For example, the substrate voltage line SUBL1 extends along the bit lines over a plurality of blocks B1 to Bn, and is connected to the substrate terminals STM1-1 to STM1-$n$. For example, the substrate voltage line SUBL2 extends along the bit lines over a plurality of blocks B1 to Bn, and is connected to the substrate terminals STM2-1 to STM2-$n$. For example, the substrate voltage line SUBL3 extends along the bit lines over a plurality of blocks B1 to Bn, and is connected to the substrate terminals STM3-1 to STM3-$n$. For example, the substrate voltage line SUBL4 extends along the bit lines over a plurality of blocks B1 to Bn, and is connected to the substrate terminals STM4-1 to STM4-$n$.

The arrangement positions of the substrate voltage lines SUBL1 to SUBL4 in each of the blocks B1 to Bn are set, for example, as illustrated in FIG. 3. For example, the substrate voltage line SUBL1 extends between the bit line BL1 and the bit line BL2 and along the bit line BL1, and is connected to the substrate terminal STM1 near the position of intersection with the source line SL. For example, the substrate voltage line SUBL2 extends between the bit line BL4 and the bit line BL5 and along the bit line BL4, and is connected to the substrate terminal STM2 near the position of intersection with the source line SL. For example, the substrate voltage line SUBL3 extends between the bit line BL7 and the bit line BL8 and along the bit line BL7, and is connected to the substrate terminal STM3 near the position of intersection with the source line SL. For example, the substrate voltage line SUBL4 extends between the bit line BL10 and the bit line BL11 and along the bit line BL10, and is connected to the substrate terminal STM4 near the position of intersection with the source line SL.

Figure 4:
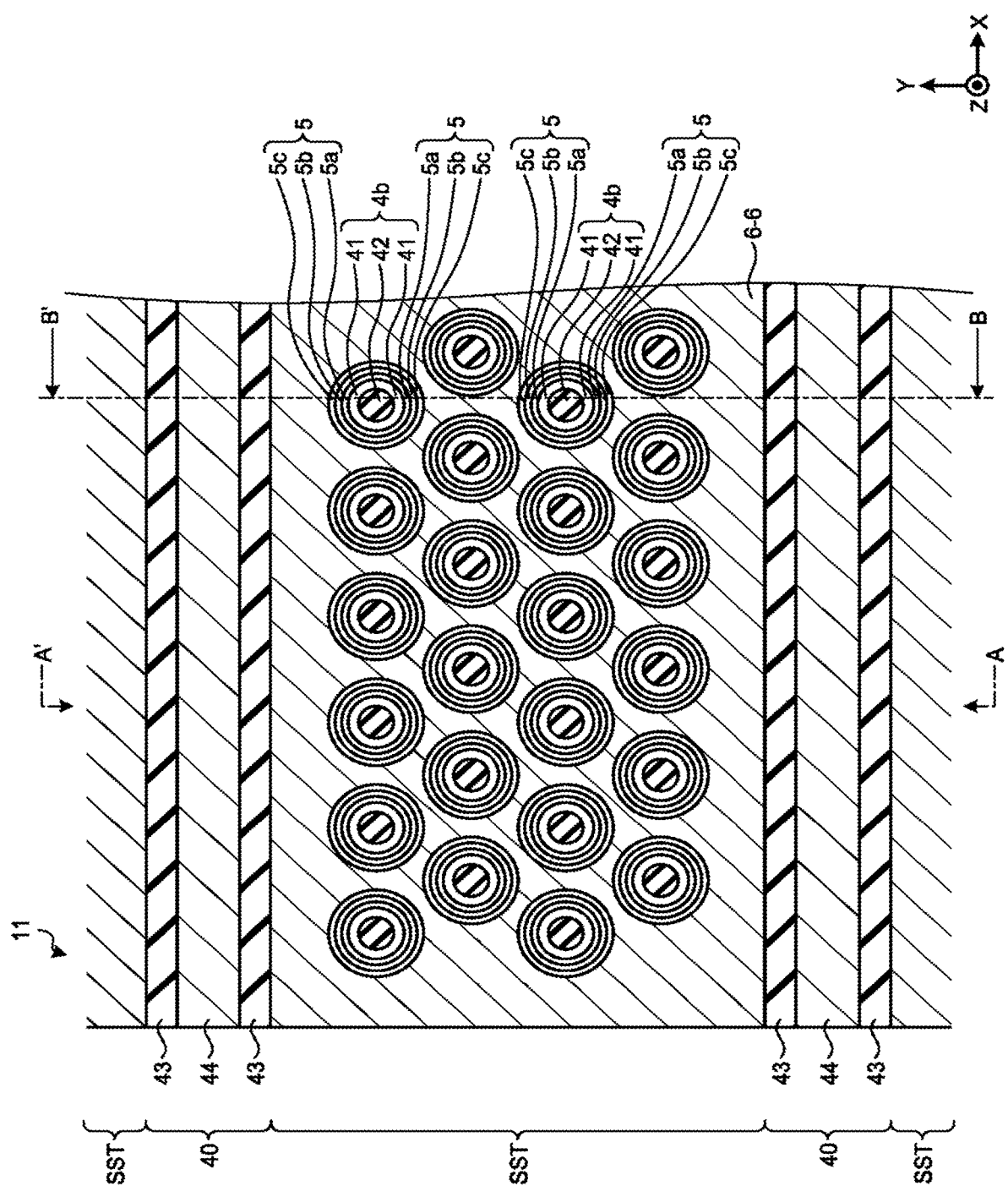
FIG. 4 is a diagram illustrating a planar configuration of the memory cell array according to the embodiment.

Next, an explanation will be given of a specifically configuration of the memory cell array 2, with reference to FIGS. 4 and 5. FIG. 4 is a diagram illustrating a planar configuration of the memory cell array 2, and illustrates a cross section (XY-section) obtained by cutting the memory cell array 2 illustrated in FIG. 1 in a planar direction (XY-direction) along a line A-A'. FIG. 5 is a diagram illustrating a sectional configuration of the memory cell array 2, and illustrates a cross section (YZ-section) obtained by cutting the memory cell array 2 illustrated in FIG. 4 in a vertical direction (YZ-direction) along a line B-B'.

As illustrated in FIGS. 4 and 5, the pillar members 4 are arrayed in a two-dimensional state in the X- and Y-directions on the substrate 3, and the pillar members 4 penetrate the stacked body SST, whereby the memory cell array 2 is constructed as a three-dimensional array of memory cells.

As illustrated in FIG. 5, the substrate 3 includes a well region (first semiconductor region) 3$a$ and diffusion regions (second semiconductor regions) 3$b$ and 3$c$. The well region 3$a$ is made of a material containing a semiconductor (for example, silicon) as the main component, and is doped with a P-type impurity (for example, boron or aluminum) in a first concentration. Each of the diffusion regions 3$b$ and 3$c$ is made of a material containing a semiconductor (for example, silicon) as the main component, and is doped with an N-type impurity (for example, phosphor or arsenic) in a second concentration higher than the first concentration.

Here, the electric potential of the well region 3$a$ can be controlled by the well control circuit 14 illustrated in FIG. 2, through the substrate voltage lines SUBL1 to SUBL4 and the substrate terminals STM1 to STM4 illustrated in FIG. 3.

Further, as illustrated in FIG. 4, a plurality of stacked bodies SST may be arranged on the substrate 3. The plurality of stacked bodies SST may be arranged at positions mutually shifted in the Y-direction with each one of separating members 40 interposed therebetween. At least those surfaces of each separating member 40 which contact with stacked bodies SST are made of an insulator, to electrically isolate a plurality of stacked bodies SST from each other. Each separating member 40 is shaped almost as a fin that extends in the X-direction and the Z-direction.

The separating members 40 are arranged one by one between a plurality of stacked bodies SST to electrically isolate the plurality of stacked bodies SST from each other. Each separating member 40 includes an insulating part 43 and an electrode part 44. The electrode part 44 is shaped almost as a fin that extends in the X-direction and the Z-direction. The end portion (bottom surface) of the electrode part 44 on the −Z side contacts with the diffusion region 3$b$ or 3$c$ of the substrate 3. At least those regions of the main surfaces of the electrode part 44 which face the stacked bodies SST are covered with portions of the insulating part 43 shaped almost as a fin that extends in the X-direction and the Z-direction. The electrode part 44 serves as a source line SL.

Here, the electric potential of the diffusion region 3b, 3c can be controlled by the SL control circuit 15 illustrated in FIG. 2, through the source line SL illustrated in FIG. 3 (the electrode part 44 illustrated in FIG. 5).

Each pillar member 4 includes a pillar lower part 4a and a pillar upper part 4b. The pillar lower part 4a is arranged on the well region 3a of the substrate 3. The pillar lower part 4a is formed of an epitaxial layer grown from the substrate 3, for example. The pillar lower part 4a is made of a material containing a semiconductor (for example, silicon) as the main component, and is doped with a P-type impurity (for example, boron or aluminum) in a third concentration. The third concentration may be set almost equal to the first concentration.

The pillar upper part 4b is arranged on the pillar lower part 4a. The pillar upper part 4b includes a semiconductor pillar 41 and a core insulating film 42. The core insulating film 42 is arranged near the central axis of the pillar member 4 and extends along the central axis of the pillar member 4. The core insulating film 42 may be made of a material containing an insulator (for example, silicon oxide) as the main component. The core insulating film 42 is almost I-shaped in the ZY-sectional view, and is almost I-shaped in the ZX-sectional view. The semiconductor pillar 41 is arranged to surround the core insulating film 42 from outside, and extends along the central axis of the pillar member 4. The semiconductor pillar 41 has an almost cylindrical shape with the bottom surface closed. The semiconductor pillar 41 is almost I-shaped in the ZY-sectional view, and is almost I-shaped in the ZX-sectional view.

The semiconductor pillar 41 includes the channel region (active region) of the corresponding memory string MS, and may be made of a material containing a semiconductor (for example, poly-silicon) doped with substantially no impurity, as the main component.

In the Z-direction, the pillar lower part 4a is positioned between the pillar upper part 4b and the substrate 3, such that the pillar lower part 4a contacts with the semiconductor pillar 41 of the pillar upper part 4b and contacts with the well region 3a of the substrate 3. Consequently, the pillar lower part 4a electrically connects the semiconductor pillar 41 to the well region 3a, and collaborates with the semiconductor pillar 41 to form the semiconductor channel of the corresponding memory string MS.

A gate insulating film 5 is arranged between the stacked body SST and the semiconductor pillar 41, and surrounds the semiconductor pillar 41 in the plan view (see FIG. 4). The gate insulating film 5 covers the lateral surface of the semiconductor pillar 41. The gate insulating film 5 is configured to have charge accumulation ability, and has an ONO type three-layer structure, in which, for example, a charge accumulation film is sandwiched by a pair of insulating films (a tunnel insulating film and a block insulating film). As illustrated in FIG. 4, the gate insulating film 5 may be configured by a three-layer structure composed of an insulating layer 5a, an insulating layer 5b, and an insulating layer 5c from the semiconductor pillar 41 side in this order. The insulating layer 5a may be made of a material containing oxide (for example, silicon oxide) as the main component. The insulating layer 5b may be made of a material containing nitride (for example, silicon nitride) as the main component. The insulating layer 5c may be made of a material containing oxide (for example, silicon oxide, metal oxide, or their stack) as the main component.

A gate insulating film 9 is arranged between a conductive film 6-1 and the pillar lower part 4a. The gate insulating film 9 may be made of a material containing oxide (for example, silicon oxide) as the main component.

In the stacked body SST, a conductive film 6 and an insulating film 7 are stacked alternately and repeatedly. In the example of FIG. 5, an insulating film 7-1, conductive film 6-1, insulating film 7-2, conductive film 6-2, insulating film 7-3, conductive film 6-3, insulating film 7-4, conductive film 6-4, insulating film 7-5, conductive film 6-5, insulating film 7-6, and conductive film 6-6 are stacked in this order on the substrate 3. Each conductive film 6 may be made of a material containing a conductor (for example, a metal, such as tungsten) as the main component. Each insulating film 7 may be made of a material containing an insulator (for example, a semiconductor oxide, such as silicon oxide) as the main component. The conductive film 6-1 serves as the selection gate line SGSL. The conductive film 6-2 serves as the word line WL0. The conductive film 6-3 serves as the word line WL1. The conductive film 6-4 serves as the word line WL2. The conductive film 6-5 serves as the word line WL3. The conductive film 6-6 serves as the selection gate line SGDL.

As illustrated in FIG. 5, at a position where the conductive film 6-1 intersects with the pillar lower part 4a and the gate insulating film 9, the source-side selection transistor ST is formed. At a position where the conductive film 6-2 intersects with the semiconductor pillar 41 and the gate insulating film 5, the memory cell MT0 is formed. At a position where the conductive film 6-3 intersects with the semiconductor pillar 41 and the gate insulating film 5, the memory cell MT1 is formed. At a position where the conductive film 6-4 intersects with the semiconductor pillar 41 and the gate insulating film 5, the memory cell MT2 is formed. At a position where the conductive film 6-5 intersects with the semiconductor pillar 41 and the gate insulating film 5, the memory cell MT3 is formed. At a position where the conductive film 6-6 intersects with the semiconductor pillar 41 and the gate insulating film 5, the drain-side selection transistor DT is formed.

An interlayer insulating film 8 is arranged on the stacked body SST. The interlayer insulating film 8 may be made of a material containing an insulator (for example, a semiconductor oxide, such as silicon oxide) as the main component.

A conductive film 32 is arranged on the interlayer insulating film 8. The conductive film 32 serves as the bit lines BL. The conductive film 32 may be made of a material containing a conductor (for example, a metal, such as tungsten or aluminum) as the main component.

Contact plugs 31 are arranged between the conductive film 32 and the semiconductor pillars 41. Each contact plug 31 is set in contact at the upper end with the conductive film 32, and is set in contact at the lower end with the corresponding semiconductor pillar 41, to electrically connect the conductive film 32 to the semiconductor pillar 41. The contact plugs 31 serve as bit line contacts. The contact plugs 31 may be made of a material containing a conductor (for example, a metal, such as tungsten) as the main component.

Figure 6:
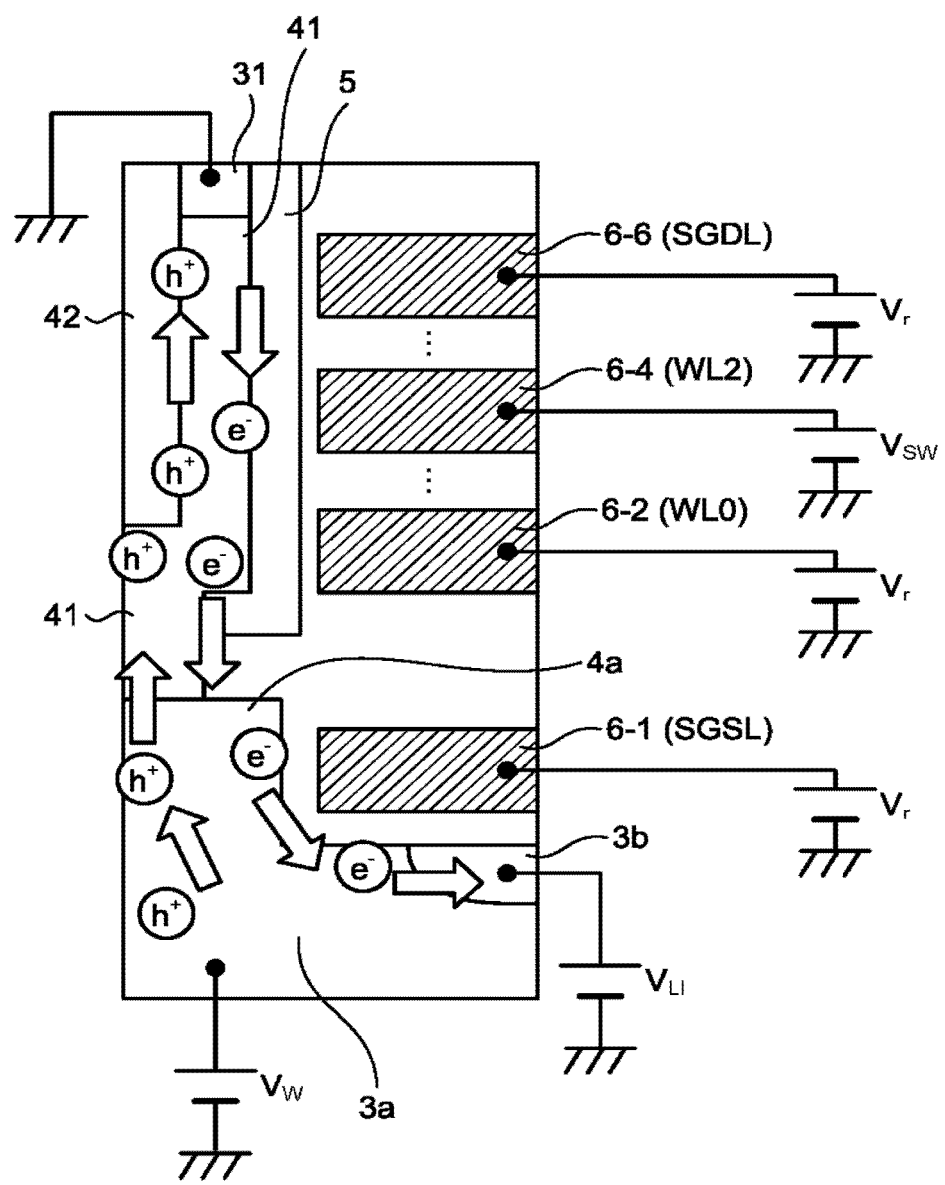
FIG. 6 is a diagram illustrating a read process operation according to the embodiment.

In the semiconductor device 1, the control circuit 10 (see FIG. 2) performs voltage application as illustrated in FIG. 6, in a process of reading information from selected memory cells. FIG. 6 is a diagram illustrating a read process operation, and schematically illustrates an area C of FIG. 5. This illustrates as an example a case where the word line WL2 (conductive film 6-4) is a selected word line and the memory cell MT2 is a selected memory cell.

The control circuit 10 sets the electric potential of the contact plug 31 to the ground potential through the selected bit line BL (conductive film 32), and applies a positive voltage $V_{LI}$ to the diffusion region 3b through the source line SL. Together with this, the control circuit 10 applies a read voltage Vr to the conductive films 6-1, 6-2, 6-3, 6-5, and 6-6 through the selection gate line SGSL, the word line WL0, the word line WL1, the word line WL3, and the selection gate line SGDL, respectively, and applies a sweep voltage Vsw for threshold detection to the conductive film 6-4 through the selected word line WL2. Consequently, the channel region of the semiconductor pillar 41 (poly-silicon film) near the interface with the gate insulating film 5 is inverted, and electrons (e⁻) are caused to flow therethrough.

Further, the control circuit 10 applies a positive voltage Vw to the well region 3a through the substrate voltage line SUBL, and thereby makes a state where holes (h⁺) flow through a region of the semiconductor pillar 41 (poly-silicon film) near the interface with the core insulating film 42.

Here, it is made to have electrons (e⁻) flowing through a route of "the contact plug 31->a region of the semiconductor pillar 41 near the interface with the gate insulating film 5->a region of the pillar lower part 4a near the conductive film 6-1->the diffusion region 3b". Further, it is made to have holes (h⁺) flowing through a route of "the well region 3a->a region of the pillar lower part 4a distant from the conductive film 6-1->a region of the semiconductor pillar 41 near the interface with the core insulating film 42->the contact plug 31".

Accordingly, the control circuit 10 preferably performs control to satisfy Vw≤$V_{LI}$. If Vw>>$V_{LI}$ stands, holes (h⁺) come to flow through a route of "the well region 3a->the diffusion region 3b", and thus make it difficult to have a desired hole current flowing through the channel region.

Further, the control circuit 10 performs control to satisfy Vw>"the application voltage to the conductive film 6-1 (=Vr in the example of FIG. 6)". If Vw≤"the application voltage to the conductive film 6-1 (=Vr in the example of FIG. 6)" stands, a potential barrier against holes (h⁺) is formed between the well region 3a and the semiconductor pillar 41. In this case, holes (h⁺) come to hardly flow through a route of "the well region 3a->a region of the pillar lower part 4a distant from the conductive film 6-1", and thus make it difficult to have a desired hole current flowing through the channel region.

Here, the control circuit 10 may substantially simultaneously perform application of the voltage Vw to the well region 3a and application of the voltage $V_{LI}$ to the diffusion region 3b. Alternatively, the control circuit 10 may first perform application of the voltage $V_{LI}$ to the diffusion region 3b, and then perform application of the voltage Vw to the well region 3a.

Figure 7:
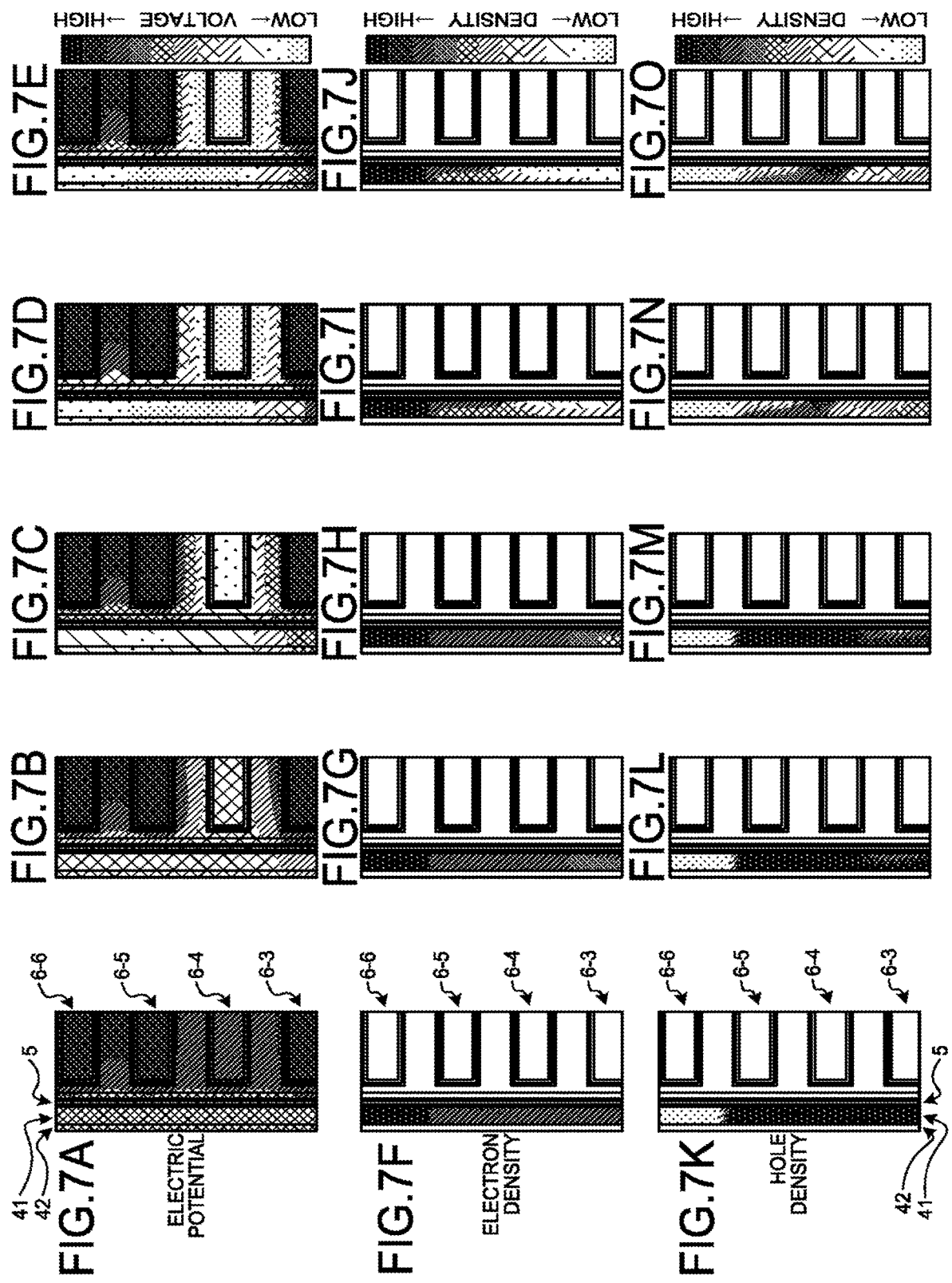
FIGS. 7A to 7O are diagrams illustrating charge density distribution in a read process according to the embodiment.

A simulation was performed about charge density distribution in this read process, and a result was obtained as illustrated in FIGS. 7A to 7O. FIGS. 7A to 7O are diagrams illustrating charge density distribution in the read process.

The states of "FIG. 7E->FIG. 7D->FIG. 7C->FIG. 7B->FIG. 7A" indicate changes in the potential distribution of the semiconductor pillar 41, which were respectively obtained by varying the sweep voltage Vsw applied to the conductive film 6-4 in the manner of "−5.5V->−2.5V->0.5V->3.5V->6.5V", while applying the voltage Vw=7.1V to the well region 3a, applying the voltage $V_{LI}$=7.1V to the diffusion region 3b, and applying the read voltage Vr=6.9V to the conductive films 6-3, 6-5, and 6-6. Here, it can be seen that the electric potential of a region of the semiconductor pillar 41 near the interface with the gate insulating film 5 is inverted by setting the sweep voltage to 3.5V or higher.

Further, there is an indication that, along with the changes in the potential distribution, the density distribution of electrons (e⁻) changes as in the states of "FIG. 7J->FIG. 7I->FIG. 7H->FIG. 7G->FIG. 7F". Here, it can be seen that electrons (e⁻) are caused to flow through a region of the semiconductor pillar 41 near the interface with the gate insulating film 5 by setting the sweep voltage to 3.5V or higher.

Further, there is an indication that, along with the changes in the potential distribution, the density distribution of holes (h⁺) changes as in the states of "FIG. 7O->FIG. 7N->FIG. 7M->FIG. 7L->FIG. 7K". Here, it can be seen that holes (h⁺) are caused to flow through a region of the semiconductor pillar 41 near the interface with the core insulating film 42 by setting the sweep voltage to 3.5V or higher.

Figure 8:
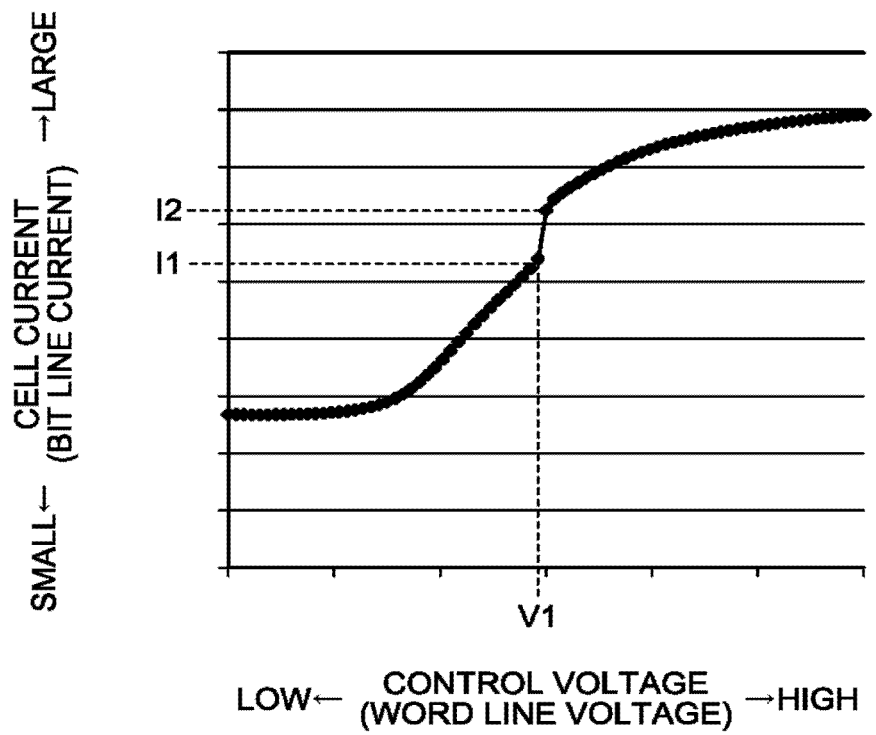
FIG. 8 is a diagram illustrating a voltage-current characteristic of a memory cell according to the embodiment.

Further, a simulation was performed about voltage-current characteristics of memory cells in this read process, and a result was obtained as illustrated in FIG. 8. FIG. 8 is a diagram illustrating a voltage-current characteristic of a memory cell. In the example of FIG. 8, it has been confirmed that the voltage-current characteristic is rendered by a cell current that steeply erects from I1 to I2 by setting the control voltage to V1 or higher, and thus allows the ON/OFF of the memory cell to be detected with high precision. Accordingly, when the current level used for detecting the ON/OFF is set to fall within a range between I1 and I2 in the sense amplifier circuit 16 (see FIG. 2), the ON/OFF of each memory cell can be detected with high precision.

As described above, according to this embodiment, when the semiconductor device 1 is operated to read information from memory cells, voltage application for holes is performed in addition to voltage application for electrons. Specifically, in the read operation, as compared with the voltage applied to the lowermost conductive film 6-1 of the stacked body SST, a higher voltage is applied to the well region 3a corresponding to a selected memory cell, and a voltage equal to or higher than this latter voltage is applied to the source-side diffusion region 3b or 3c. Consequently, it is possible to cause a hole current to flow near the interface between the semiconductor pillar 41 and the core insulating film 42 while causing an electron current to flow near the interface between the semiconductor pillar 41 and the gate insulating film 5. This enables to increase the cell current easily, and to properly read information stored in the memory cells.

Figure 9:
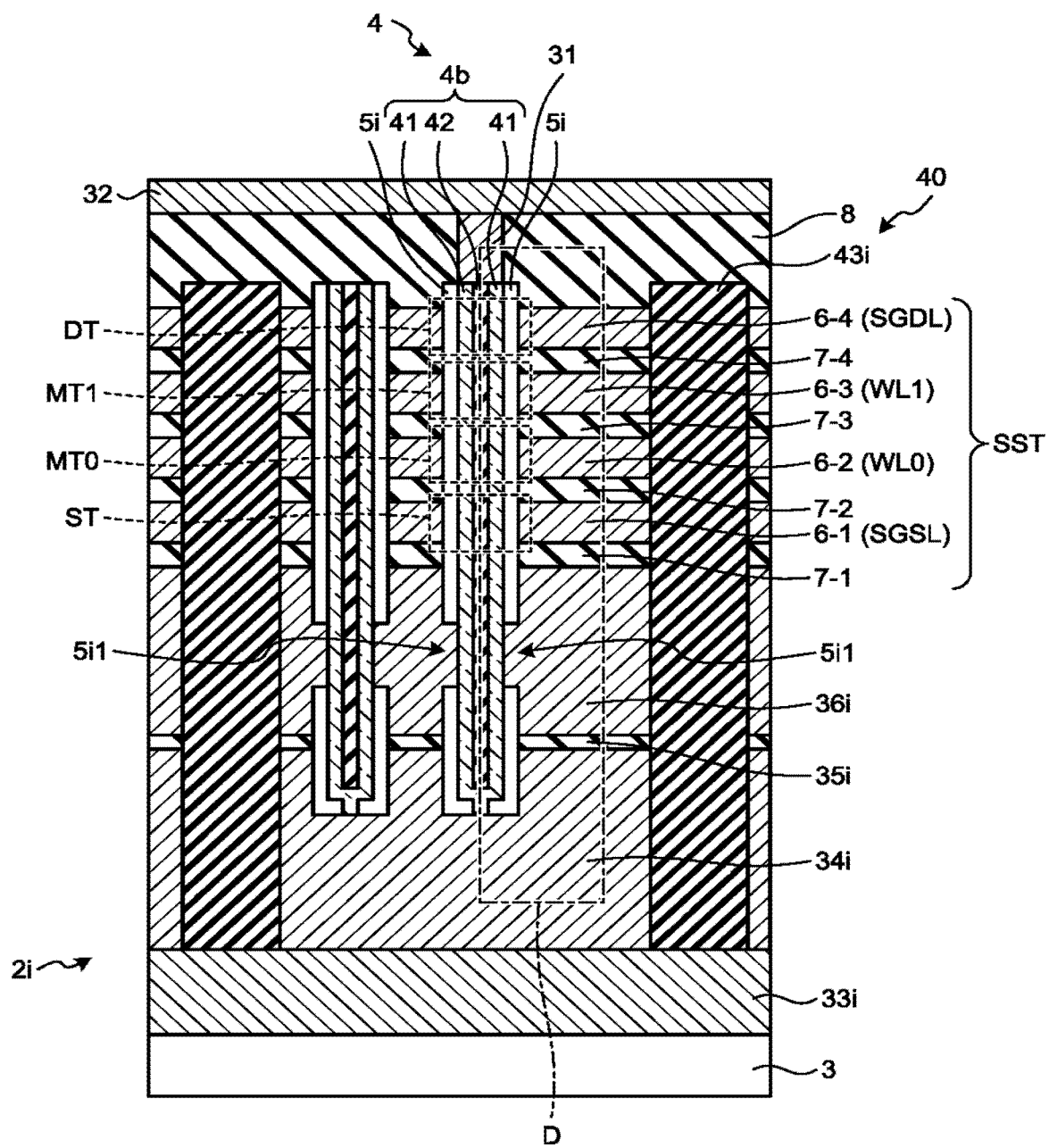
FIG. 9 is a sectional view illustrating a configuration of a memory cell array according to a modification of the embodiment.

It should be noted that the idea according to this embodiment may be applied also to a configuration of a memory cell array 2i illustrated in FIG. 9. FIG. 9 is a sectional view illustrating a configuration of the memory cell array 2i according to a modification of the embodiment. In the configuration illustrated in FIG. 9, a conductive film 33i, a semiconductor film 34i, an insulating film 35i, and a semiconductor film 36i are stacked in this order between the substrate 3 and the stacked body SST. The conductive film 33i contacts with the lower surface of the semiconductor film 34i, and contacts with the lower surfaces of insulating parts 43i that fill respective separating members 40. The conductive film 33i may be made of a material containing a conductor (for example, a metal, such as tungsten) as the main component. The semiconductor film 34i is made of a material containing a semiconductor (for example, poly-silicon) as the main component, and is doped with a P-type impurity (for example, boron or aluminum) in a fourth concentration. The insulating film 35i is made of a material containing an insulator (for example, a semiconductor oxide, such as silicon oxide) as the main component. The semiconductor film 36$i$ is made of a material containing a semiconductor (for example, poly-silicon) as the main component, and is doped with an N-type impurity (for example, phosphor or arsenic) in a fifth concentration. The fifth concentration may be set higher than the fourth concentration. The semiconductor film 36$i$ serves as the source line SL. A gate insulating film 5$i$ penetrates the stacked body SST in the Z-direction, while covering the lateral surface of the semiconductor pillar 41. The gate insulating film 5$i$ is provided with an opening 5$i$1 in part of the portion sandwiched between the semiconductor pillar 41 and the semiconductor film 36$i$. Consequently, the semiconductor film 36$i$ is electrically connected to the lateral surface of the semiconductor pillar 41 through the opening 5$i$1.

Figure 10:
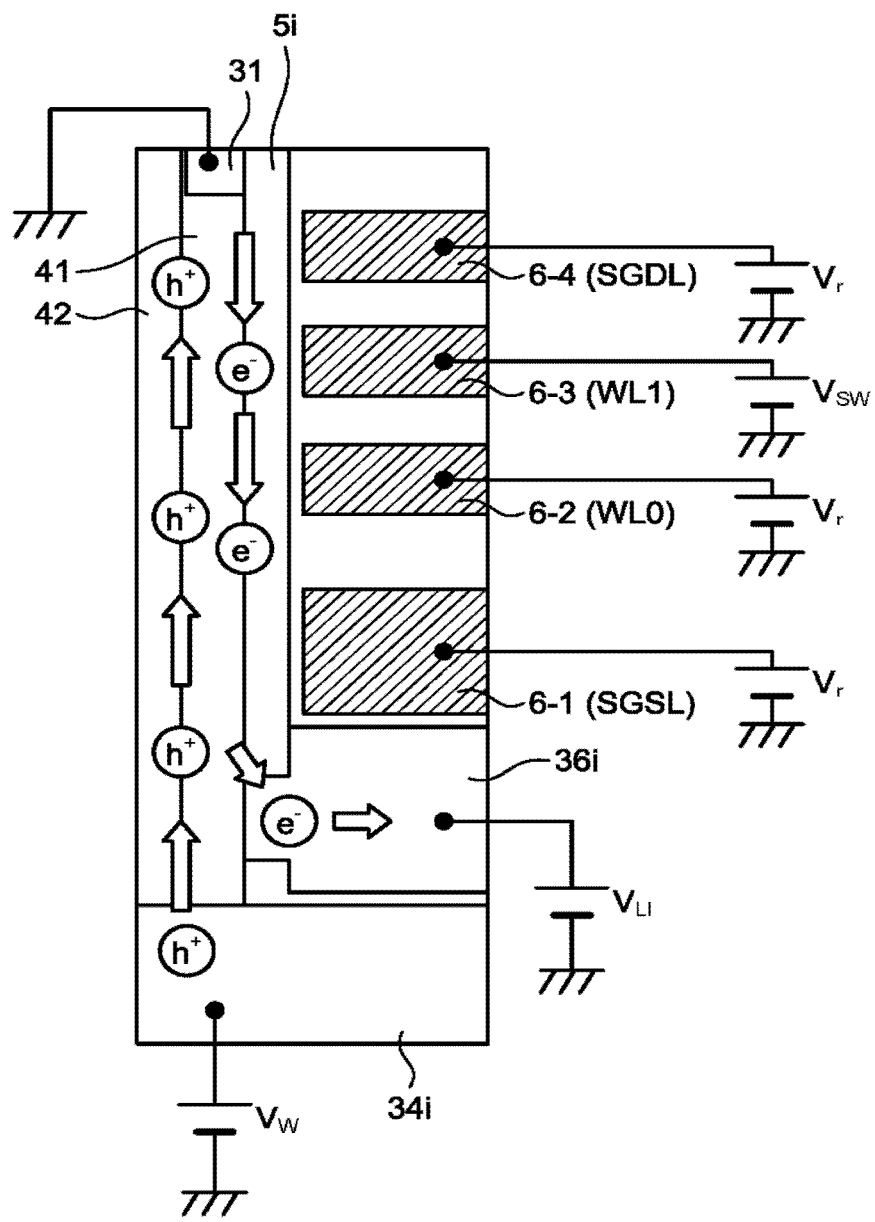
FIG. 10 is a diagram illustrating a read process operation according to the modification of the embodiment.

In this case, the control circuit 10 (see FIG. 2) performs voltage application as illustrated in FIG. 10, in a process of reading information from selected memory cells. FIG. 10 is a diagram illustrating a read process operation according to the modification of the embodiment, and schematically illustrates an area D of FIG. 9. This illustrates as an example a case where the word line WL1 (conductive film 6-3) is a selected word line and the memory cell MT1 is a selected memory cell.

The control circuit 10 sets the electric potential of the contact plug 31 to the ground potential through the selected bit line BL (conductive film 32), and applies a positive voltage $V_{LI}$ to the semiconductor film 36$i$ through the source line SL. Together with this, the control circuit 10 applies a read voltage Vr to the conductive films 6-1, 6-2, and 6-4 through the selection gate line SGSL, the word line WL0, and the selection gate line SGDL, respectively, and applies a sweep voltage Vsw for threshold detection to the conductive film 6-3 through the selected word line WL1. Consequently, the channel region of the semiconductor pillar 41 (poly-silicon film) near the interface with the gate insulating film 5$i$ is inverted, and electrons ($e^-$) are caused to flow therethrough.

Further, the control circuit 10 applies a positive voltage Vw to the semiconductor film 34$i$ through the substrate voltage line SUBL, and thereby makes a state where holes ($h^+$) flow through a region of the semiconductor pillar 41 (poly-silicon film) near the interface with the core insulating film 42.

Here, it is made to have electrons ($e^-$) flowing through a route of "the contact plug 31->a region of the semiconductor pillar 41 near the interface with the gate insulating film 5$i$->the semiconductor film 36$i$". Further, it is made to have holes ($h^+$) flowing through a route of "the semiconductor film 34$i$->a region of the semiconductor pillar 41 near the interface with the core insulating film 42->the contact plug 31".

Accordingly, the control circuit 10 preferably performs control to satisfy Vw≤$V_{LI}$. If Vw>>$V_{LI}$ stands, holes ($h^+$) come to flow through a route of "the semiconductor film 34$i$->the semiconductor film 36$i$", and thus make it difficult to have a desired hole current flowing through the channel region.

Further, the control circuit 10 performs control to satisfy Vw>"the application voltage to the conductive film 6-1 (=Vr in the example of FIG. 10)". If Vw≤"the application voltage to the conductive film 6-1 (=Vr in the example of FIG. 10)" stands, a potential barrier against holes ($h^+$) is formed in a region of the semiconductor pillar 41 at almost the same height as the conductive film 6-1. In this case, holes ($h^+$) come to hardly flow through a route of "the semiconductor film 34$i$->a region of the semiconductor pillar 41 near the interface with the core insulating film 42", and thus make it difficult to have a desired hole current flowing through the channel region.

Here, the control circuit 10 may substantially simultaneously perform application of the voltage Vw to the semiconductor film 34$i$ and application of the voltage $V_{LI}$ to the semiconductor film 36$i$. Alternatively, the control circuit 10 may first perform application of the voltage $V_{LI}$ to the semiconductor film 36$i$, and then perform application of the voltage Vw to the semiconductor film 34$i$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor region;
   a stacked body of conductive films arranged in a stacking direction with an insulator interposed;
   a semiconductor channel that penetrates the stacked body in the stacking direction, and is electrically connected at one end to the first semiconductor region;
   a gate insulating film arranged between the stacked body and the semiconductor channel; and
   a control circuit that supplies a first voltage to a closest conductive film of the stacked body to the first semiconductor region, and supplies a second voltage higher than the first voltage to the first semiconductor region, at a time of reading information from one of memory cells formed at positions where the conductive films intersect with the semiconductor channel.

2. The semiconductor device according to claim 1, further comprising a second semiconductor region that is arranged between the first semiconductor region and the closest conductive film, and is electrically connected to the one end of the semiconductor channel,
   wherein the control circuit supplies a third voltage equal to the second voltage or higher than the second voltage to the second semiconductor region, at the time of reading.

3. The semiconductor device according to claim 2, wherein
   the first semiconductor region contains an impurity of a first conductivity type, and
   the second semiconductor region contains an impurity of a second conductivity type opposite to the first conductivity type.

4. The semiconductor device according to claim 3, wherein
   a concentration of the impurity of the second conductivity type in the second semiconductor region is higher than a concentration of the impurity of the first conductivity type in the first semiconductor region.

5. The semiconductor device according to claim 2, wherein
   the first semiconductor region is arranged in a substrate,
   the second semiconductor region is arranged inside the first semiconductor region in the substrate, and the one end of the semiconductor channel contacts with the first semiconductor region, and is electrically connected to the second semiconductor region through the first semiconductor region.

6. The semiconductor device according to claim 5, wherein
the first semiconductor region is a well region arranged in the substrate.

7. The semiconductor device according to claim 5, wherein
another end of the semiconductor channel is arranged on an opposite side to the substrate, and is supplied with a ground voltage at the time of reading.

8. The semiconductor device according to claim 1, wherein
the semiconductor channel includes a first portion arranged around a core insulating film that extends inside the stacked body in the stacking direction.

9. The semiconductor device according to claim 8, wherein
the semiconductor channel further includes a second portion arranged below the core insulating film and between the first portion and the first semiconductor region.

10. The semiconductor device according to claim 9, wherein
the second portion is an epitaxial semiconductor layer formed on the first semiconductor region.

11. The semiconductor device according to claim 9, wherein
each of the first semiconductor region and the second portion of the semiconductor channel contains an impurity of a first conductivity type.

12. The semiconductor device according to claim 9, wherein
a concentration of an impurity of a first conductivity type in the first portion of the semiconductor channel is lower than a concentration of an impurity of a first conductivity type in each of the first semiconductor region and the second portion of the semiconductor channel.

13. The semiconductor device according to claim 9, wherein
the closest conductive film to the first semiconductor region is arranged around the second portion of the semiconductor channel through the gate insulating film.

14. The semiconductor device according to claim 2, wherein
the first semiconductor region contacts with the one end of the semiconductor channel, and
the second semiconductor region contacts with a lateral surface of the semiconductor channel around the one end.

15. The semiconductor device according to claim 14, wherein
the gate insulating film includes an opening around the one end of the semiconductor channel, and
the second semiconductor region penetrates the gate insulating film through the opening and contacts with the lateral surface of the semiconductor channel around the one end.

16. The semiconductor device according to claim 1, wherein
the semiconductor channel is made of a material containing poly-silicon as a main component.

17. A control method of a semiconductor device, which includes a first semiconductor region, a stacked body of conductive films arranged in a stacking direction with an insulator interposed, a semiconductor channel that penetrates the stacked body in the stacking direction, and is electrically connected at one end to the first semiconductor region, and a gate insulating film arranged between the stacked body and the semiconductor channel,
the control method comprising:
supplying a first voltage to a closest conductive film of the stacked body to the first semiconductor region, and supplying a second voltage higher than the first voltage to the first semiconductor region, at a time of reading information from one of memory cells formed at positions where the conductive films intersect with the semiconductor channel.

18. The control method according to claim 17, wherein
the semiconductor device further includes a second semiconductor region that is arranged between the first semiconductor region and the closest conductive film, and is electrically connected to the one end of the semiconductor channel, and
the control method further comprises supplying a third voltage equal to the second voltage or higher than the second voltage to the second semiconductor region, at the time of reading.

19. The control method according to claim 18, wherein
the control method substantially simultaneously performs the supplying a second voltage to the first semiconductor region, and the supplying a third voltage to the second semiconductor region.

20. The control method according to claim 18, wherein
the control method first performs the supplying a third voltage to the second semiconductor region, and then performs the supplying a second voltage to the first semiconductor region.

* * * * *